(12) United States Patent
Kim et al.

(10) Patent No.: US 8,183,683 B1
(45) Date of Patent: May 22, 2012

(54) SEMICONDUCTOR DEVICE AND FABRICATING METHOD THEREOF

(75) Inventors: Joon Su Kim, Seoul (KR); Jung Soo Park, Seoul (KR); Tae Kyung Hwang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 336 days.

(21) Appl. No.: 12/549,068

(22) Filed: Aug. 27, 2009

(51) Int. Cl.
*H01L 23/488* (2006.01)

(52) U.S. Cl. .............. 257/690; 257/E23.023; 438/124

(58) Field of Classification Search .......... 257/690, 257/786; 438/121, 124
See application file for complete search history.

(56) References Cited

U.S. PATENT DOCUMENTS

| | | | |
|---|---|---|---|
| 6,306,751 B1 * | 10/2001 | Patel et al. ................... | 438/614 |
| 6,348,742 B1 * | 2/2002 | MacPherson ................. | 257/786 |
| 6,515,366 B1 * | 2/2003 | Chiou et al. .................. | 257/758 |
| 6,849,533 B2 * | 2/2005 | Chang et al. ................. | 438/612 |

* cited by examiner

*Primary Examiner* — Roy Potter
(74) *Attorney, Agent, or Firm* — McKay and Hodgson, LLP; Serge J. Hodgson (57) ABSTRACT

A semiconductor device is provided. The semiconductor device comprises a semiconductor die having bond pads, each of which consists of a first bond pad made of a material whose ionization tendency is relatively low and a second bond pad made of a material whose ionization tendency is relatively high. The second bond pads function as sacrificial anodes to prevent the occurrence of galvanic corrosion at the interfaces between the first bond pads and conductive wires. In an embodiment, the upper surfaces of the second bond pads are marked instead of those of the first bond pads, which reduces the number of defects in the first bond pads. A method for fabricating the semiconductor device is also provided.

18 Claims, 8 Drawing Sheets

SEMICONDUCTOR DEVICE AND FABRICATING METHOD THEREOF

BACKGROUND OF THE INVENTION

1. Field of the Invention

The present invention relates to a semiconductor device and a method for fabricating the same.

2. Description of the Related Art

A typical semiconductor device has a structure in which conductive patterns of a substrate are interconnected to pads of a semiconductor die attached to the upper surface of the substrate through wires.

The wires are made of gold or copper and the bond pads are made of aluminum. The use of the different metals gives rise to a potential difference between the wires and the bond pads. This potential difference allows electrons to migrate between the wires and the bond pads. As a result, the wires having a noble potential tend to corrode at a reduced rate and the bond pads having an active potential tend to corrode at an accelerated rate, resulting in corrosion at the interfaces between the wires and the bond pads. This corrosion is called "galvanic corrosion."

Galvanic corrosion weakens the bonding between the conductive wires and the semiconductor die. That is, galvanic corrosion is considered to be a major factor that causes disconnection of the conductive wires from the semiconductor die, resulting in operational failure or malfunction of the semiconductor device.

In recent years, various attempts have been made to improve the performance of semiconductor devices. Particularly, methods have been proposed for stacking a plurality of semiconductor dies in one semiconductor device using film-over-wires (FOWs). According to these methods, however, galvanic corrosion between wires and bond pads becomes a more serious problem during heating for the solidification of the FOWs.

BRIEF SUMMARY OF THE INVENTION

A semiconductor device is provided. The semiconductor device comprises a semiconductor die having bond pads, each of which consists of a first bond pad made of a material whose ionization tendency is relatively low and a second bond pad made of a material whose ionization tendency is relatively high. The second bond pads function as sacrificial anodes to prevent the occurrence of galvanic corrosion at the interfaces between the first bond pads and conductive wires. In an embodiment, the upper surfaces of the second bond pads are marked instead of those of the first bond pads, which reduces the number of defects in the first bond pads. A method for fabricating the semiconductor device is also provided.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1A:
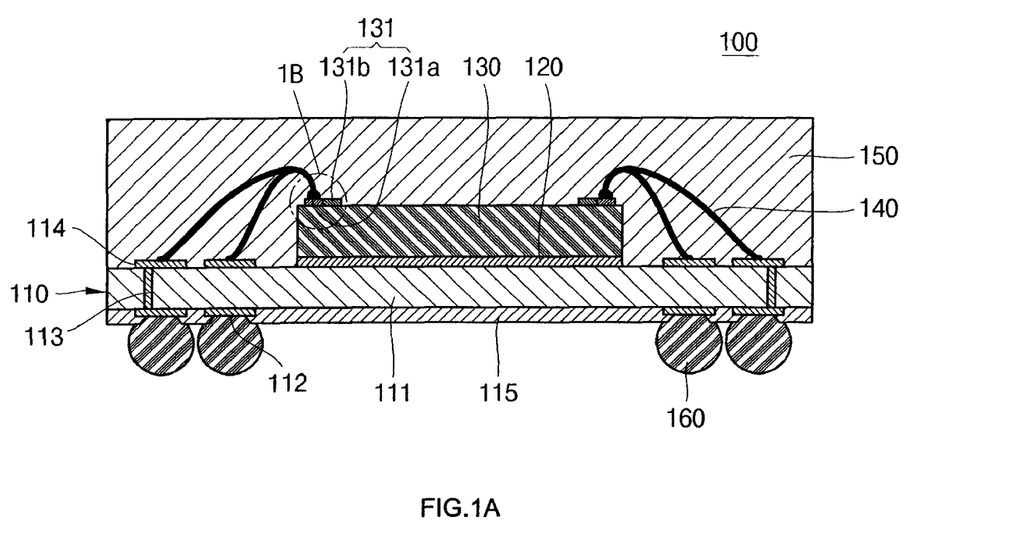
FIG. 1A is a cross-sectional view illustrating a semiconductor device according to an embodiment of the present invention.
Figure 1B:
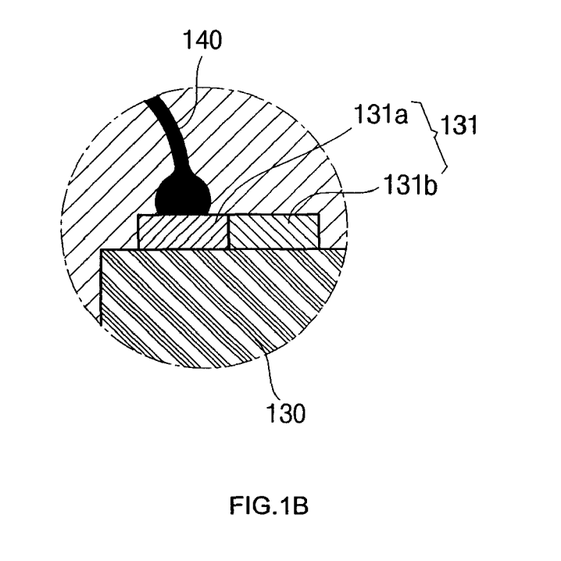
FIG. 1B is an enlarged view illustrating area 1B of FIG. 1A.
Figure 1C:
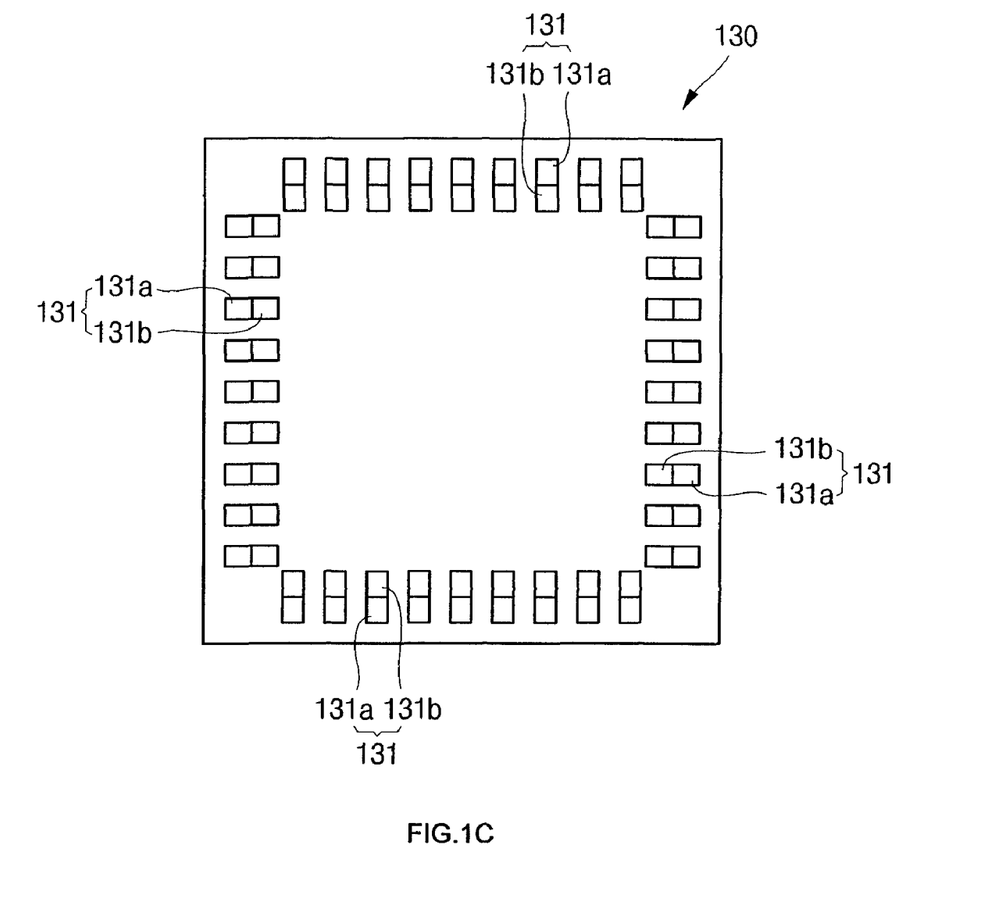
FIG. 1C is a plan view of a semiconductor die used in the semiconductor device according to the embodiment of the present invention.

Referring to FIG. 1A, there is illustrated a cross-sectional view of a semiconductor device 100 according to an embodiment of the present invention. Referring to FIG. 1B, there is illustrated an enlarged view of area 1B of FIG. 1A. Referring to FIG. 1C, there is illustrated a plan view of a semiconductor die 130 used in the semiconductor device 100 according to the embodiment of the present invention.

As illustrated in FIGS. 1A through 1C, the semiconductor die 100 comprises a substrate 110, a semiconductor die 130 attached to the upper surface of the substrate 110, conductive wires 140 electrically connecting the substrate 110 to the semiconductor die 130, and an encapsulant 150 formed surrounding the semiconductor die 130. The semiconductor device 100 may further comprise solder balls 160 formed under the substrate 110.

The substrate 110 provides a base for the fabrication of the semiconductor device 110. The substrate 110 includes an insulating layer 111, lands 112 formed on the lower surface of the insulating layer 111, conductive vias 113 penetrating the insulating layer 111 and connected to the respective lands 112, conductive patterns 114 formed on the upper surface of the insulating layer 111 to be connected to the respective conductive vias 113, and a solder mask 115 covering an area other than areas where the lands 112 are formed.

The insulating layer 111 is substantially in the form of a thin plate and plays a basic role in insulating the overlying semiconductor die 130 from an external circuit. To this end, the insulating layer 111 is formed of an electrically insulating material such as a thermosetting resin or a polymer (e.g., polyimide).

The lands 112 are formed on the lower surface of the insulating layer 111. Only one land 112 may be provided. In the case of a land grid array (LGA) type, the lands 112 are directly electrically connected to an external circuit. In the case of a ball grid array (BGA) type, the lands 112 are electrically connected to an external circuit through solder balls 160. To this end, the lands 112 are made of highly electrically conductive copper or its equivalent.

The conductive vias 113 are formed so as to penetrate the insulating layer 111 in relation to the respective lands 112. The conductive vias 113 electrically connect the lands 112 and the respective conductive patterns 114. The conductive vias 113 may be formed by filling via-holes with a metal when the conductive patterns 114 are formed. The conductive vias 113 are made of highly electrically conductive copper or its equivalent.

The conductive patterns 114 are formed on the upper surface of the insulating layer 111. The conductive patterns 114 are electrically connected to the semiconductor die 130. The conductive patterns 114 are electrically connected to an external circuit through the conductive vias 113 and the lands 112. The conductive patterns 114 are made of highly electrically conductive copper or its equivalent.

The solder mask 115 is formed on the lower surface of the insulating layer 111. The solder mask 115 is formed so as to cover an area other than areas where the lands 112 are exposed. The solder mask 115 is formed of a highly insulating material selected from benzocyclobutene (BCB) resins, polyimide and equivalents thereof.

The semiconductor die 130 is attached to the upper surface of the substrate 110 by means of an adhesive 120. The adhesive is a highly viscous material (such as an epoxy resin or an adhesive tape) or its equivalent.

The semiconductor die 130 is an integrated circuit made of single-crystal silicon, polycrystalline silicon, amorphous silicon or an equivalent thereof as a main material using a semiconductor manufacturing process.

The semiconductor die 130 includes one or more bond pads 131 (131a; 131b) on the upper surface thereof. The bond pads 131 provide passages through which the semiconductor die 130 electrically inputs/outputs signals from/to the outside.

Each of the bond pads 131 is divided into the first bond pad 131a and the second bond pad 131b. First bond pad 131a is sometimes called a protected or cathodic bond pad 131a. Second bond pad 131b is sometimes called a sacrificial or anodic bond pad 131b. The first bond pads 131a contact and are electrically connected to the respective second bond pads 131b.

The first bond pad 131a is positioned outwardly relative to the second bond pad 131b in the region of the bond pad 131. The first bond pad 131a is bonded to the corresponding conductive wire 140 and is connected to the corresponding conductive pattern 114 of the substrate 110 through the conductive wire 140. Accordingly, the outward positioning of the first bond pads 131a with respect to a plane parallel to the upper surface of the semiconductor die 130, sometimes called the plane of the semiconductor die 130, leads to a reduction in the length of the conductive wires 140, thus contributing to the reduction of electrical noise signals. The first bond pads 131a can be made of aluminum.

Each of the second bond pads 131b is positioned more inwardly than and in lateral contact with the corresponding first bond pad 131a. The second bond pads 131b prevent the occurrence of galvanic corrosion in the first bond pads 131a. To this end, the second bond pads 131b are made of a metal having a higher ionization tendency than a metal for the first bond pads 131a, so that the second bond pads 131b can be more readily oxidized than the first bond pads 131a. That is, the second bond pads 131b function as sacrificial anodes and are corroded at a higher rate than the first bond pads 131a. The second bond pads are made of a material selected from magnesium, magnesium alloys, zinc, zinc alloys, cadmium, beryllium, and combinations thereof. The oxidation/corrosion mechanism of the bond pads 131 prevents the occurrence of galvanic corrosion at the interfaces between the first bond pads 131a and the conductive wires 140 after bonding.

In a test for the integrity of the wire bonding using a probe, the second bond pads 131b may be marked instead of the first bond pads 131b, which ensures firm bonding between the conductive wires 140 and the first bond pads 131a.

Although not particularly shown in the drawings, there is no need to bond the second bond pads 131b to the first bond pads 131a in a one-to-one relationship. Namely, one or more second bond pads 131b may be bonded to each of the first bond pads 131a. Stated another way, the bond pads 131 include the first bond pads 131a and at least one second bond pad 131b electrically connected to the first bond pads 131a. In this case, there is no restriction on the position of the second bond pads 131b on the upper surface of the semiconductor die 130. This irregular configuration of the bond pads 131 is disadvantageous in terms of anticorrosive effects but allows the formation of the second bond pads 131b in a simple manner, which enables the fabrication of the semiconductor device 100 at reduced cost, when compared to the configuration of the first and second bond pads 131a and 131b in a one-to-one relationship.

The conductive wires 140 electrically connect the substrate 110 and the semiconductor die 130. Specifically, the conductive wires 140 electrically connect the conductive patterns 114 of the substrate 110 and the first bond pads 131a of the semiconductor die 130. The conductive wires 140 may be made of a highly conductive material, such as gold, silver or copper.

According to the prior art, the use of conductive wires made of gold or copper, which is a nobler metal than aluminum, causes galvanic corrosion in aluminum-made bond pads.

In contrast, the use of the second bond pads 131b made of a material having a higher ionization tendency than a material for the first bond pads 131a in the semiconductor device 100 according to the embodiment of the present invention prevents the occurrence of galvanic corrosion in the bond pads 131 of the semiconductor die 130.

The encapsulant 150 is formed surrounding the semiconductor die 130 and the conductive wires 140 on the substrate 110. The encapsulant 150 protects the elements from the ambient environment. The encapsulant 150 is formed using a material selected from epoxy resins, silicone resins and equivalents thereof that are widely used in the art.

The solder balls 160 have a substantially spherical shape and are connected to the lower surface of the substrate 110. In a ball grid array (BGA) structure, the solder balls 160 electrically connect the lands 112 of the substrate 110 and an external circuit. The solder balls 160 are easy to produce and handle and are made of a material selected from tin, lead, silver, silver alloys and combinations thereof, all of which have melting points.

As described above, in the semiconductor device 100 according to the embodiment of the present invention, each of the bond pads 131 of the semiconductor die 130 consists of the first bond pad 131a made of a material whose ionization tendency is relatively low and the second bond pad 131b made of a material whose ionization tendency is relatively high. Therefore, the second bond pads 131b function as sacrificial anodes to prevent the occurrence of galvanic corrosion in the first bond pads 131a bonded to the conductive wires 140 and to prevent damage of the first bond pads 131a resulting from marking by a probe.

Hereinafter, a description will be given of the construction of a semiconductor device 200 according to a further embodiment of the present invention.

Figure 2A:
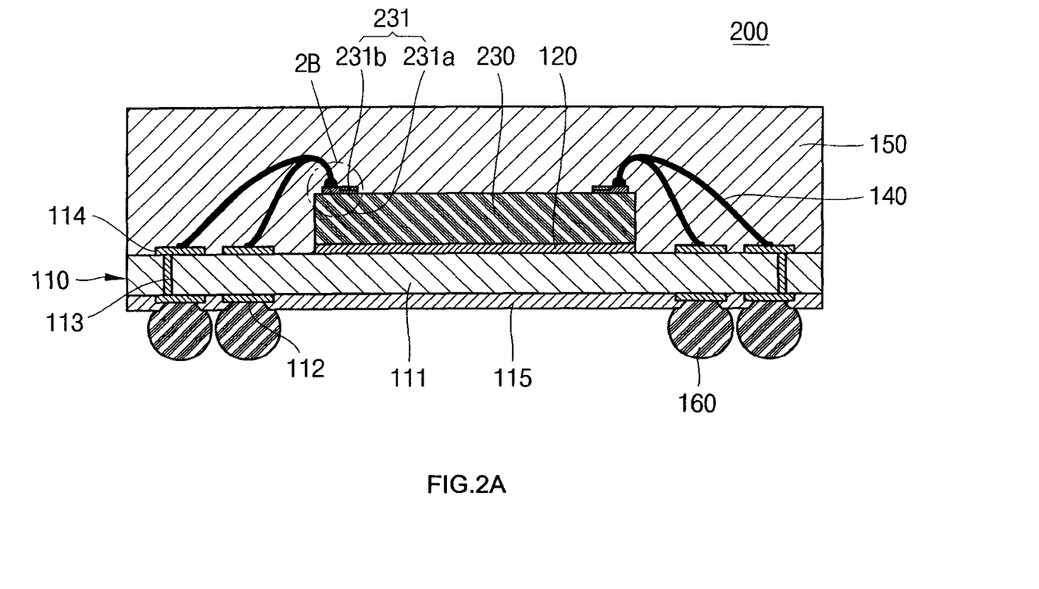
FIG. 2A is a cross-sectional view illustrating a semiconductor device according to a further embodiment of the present invention.
Figure 2B:
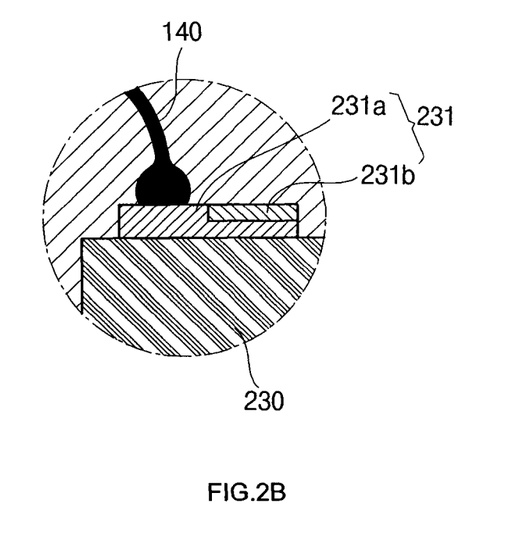
FIG. 2B is an enlarged view illustrating area 2B of FIG. 2A.

Referring to FIG. 2A, there is illustrated a cross-sectional view of the semiconductor device 200. Referring to FIG. 2B, there is illustrated an enlarged view of area 2B of FIG. 2A.

As illustrated in FIGS. 2A and 2B, the semiconductor device 200 comprises a substrate 110, a semiconductor die 230 attached to the substrate 110 by means of an adhesive 120, conductive wires 140, and an encapsulant 150. The semiconductor device 200 may further comprise solder balls 160 formed under the substrate 110. The same reference numerals are used to designate elements having the same structure and function as the elements of the previous embodiment. Differences of the semiconductor device 200 from the semiconductor device 100 will be mainly explained below.

The semiconductor die 230 is attached to the upper surface of the substrate 110 by means of the adhesive 120. The semiconductor die 230 includes one or more bond pads 231 (231a; 231b) on the upper surface thereof. In accordance with this embodiment, each bond pad 231 includes a first bond pad 231a and a second bond pad 231b. First bond pad 231a is sometimes called a protected or cathodic bond pad 231a. Second bond pad 231b is sometimes called a sacrificial or anodic bond pad 231b.

The first bond pads 231a are formed on the upper surface of the semiconductor die 230 and are inwardly indented to a predetermined depth to form the second bond pads 231b.

The bond pads 231 are planar in shape, which is determined as a whole by the shape of the first bond pads 231a. Inner portions of the first bond pads 231a with respect to the plane of the semiconductor die 230 are etched to a predetermined depth to form etched cavities, sometimes called etched portions, in the first bond pads 231a. The second bond pads 231b are formed in the respective etched cavities of the first bond pads 231a. The first bond pads 231a are connected to conductive patterns 114 of the substrate 110 through the respective conductive wires 140.

The second bond pads 231b are filled in the etched portions of the first bond pads 231a. The second bond pads 231b are made of a material whose ionization tendency is higher than a material for the first bond pads 231a. Accordingly, the second bond pads 231b function as sacrificial anodes to prevent the first bond pads 231a from galvanic corrosion.

As described above, in the semiconductor device 200 according to the embodiment of the present invention, the bond pads 231 are formed by etching inner portions of the first bond pads 231a with respect to the plane of the semiconductor die 230 to a predetermined depth and forming the second bond pads 231b in the respective etched portions of the first bond pads 231a to prevent the first bond pads 231a from galvanic corrosion.

Hereinafter, a description will be given of the construction of a semiconductor device 300 according to another embodiment of the present invention.

Figure 3A:
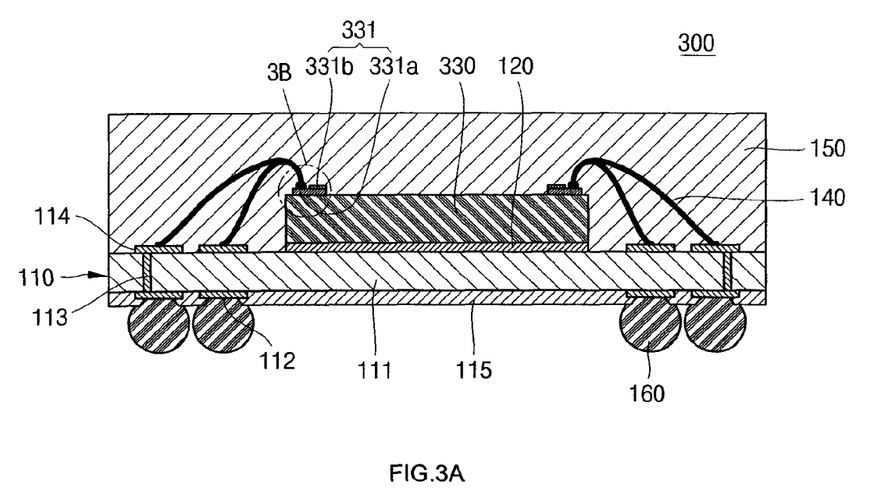
FIG. 3A is a cross-sectional view illustrating a semiconductor device according to another embodiment of the present invention.
Figure 3B:
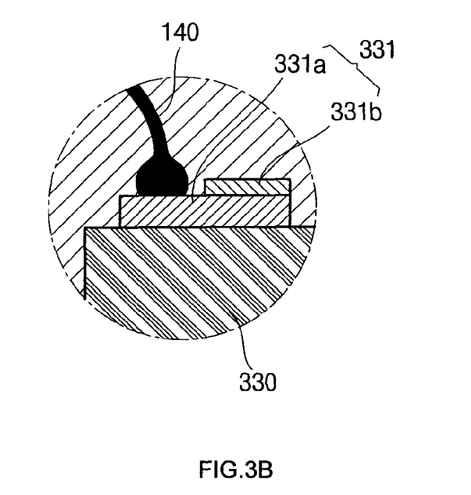
FIG. 3B is an enlarged view illustrating area 3B of FIG. 3A.

Referring to FIG. 3A, there is illustrated a cross-sectional view of the semiconductor device 300. Referring to FIG. 3B, there is illustrated an enlarged view of area 3B of FIG. 3A.

As illustrated in FIGS. 3A and 3B, the semiconductor device 300 comprises a substrate 110, a semiconductor die 330 attached to the substrate 110 by means of an adhesive 120, conductive wires 140, and an encapsulant 150. The semiconductor device 300 may further comprise solder balls 160 formed under the substrate 110. The same reference numerals are used to designate elements having the same structure and function as the elements of the previous embodiments. Differences of the semiconductor device 300 and the semiconductor devices 100 and 200 will be mainly explained below.

The semiconductor die 330 is attached to the upper surface of the substrate 110 by means the adhesive 120. The semiconductor die 330 includes one or more bond pads 331 (331a; 331b) on the upper surface thereof. In accordance with this embodiment, each bond pad 331 includes a first bond pad 331a and a second bond pad 331b. First bond pad 331a is sometimes called a protected or cathodic bond pad 331a. Second bond pad 331b is sometimes called a sacrificial or anodic bond pad 331b.

The first bond pads 331a are formed on the upper surface of the semiconductor die 330. The bond pads 331 are substantially planar in shape, which is determined as a whole by the shape of the first bond pads 331a. A portion of the upper surface of each of the first bond pads 331a is covered with the corresponding second bond pad 331b. The first bond pads 331a are connected to conductive patterns 114 of the substrate 110 through the respective conductive wires 140.

Each of the second bond pads 331b is formed on a portion of the upper surface of the first bond pad 331a. The second bond pad 331b protrudes from the inner portion of the first bond pad 331a with respect to the plane of the semiconductor die 330. The second bond pads 331b are made of a material having a higher ionization tendency than a material for the first bond pads 331a to prevent the first bond pads 331a from galvanic corrosion. Further, the second bond pads 331b are formed in an easy manner on the upper surfaces of the first bond pads 331a without the need for additional etching, which enables the fabrication of the semiconductor device 300 at reduced cost.

As described above, in the semiconductor device 300 according to the embodiment of the present invention, the first bond pads 331a are made of a material whose ionization tendency is relatively low and the second bond pads 331b are made of a material whose ionization tendency is relatively high. Therefore, the second bond pads 331b can be formed by relatively simple processing to prevent the first bond pads 331a bonded to the conductive wires 140 from galvanic corrosion.

Hereinafter, a description will be given of the construction of a semiconductor device 400 according to another embodiment of the present invention.

Figure 4:
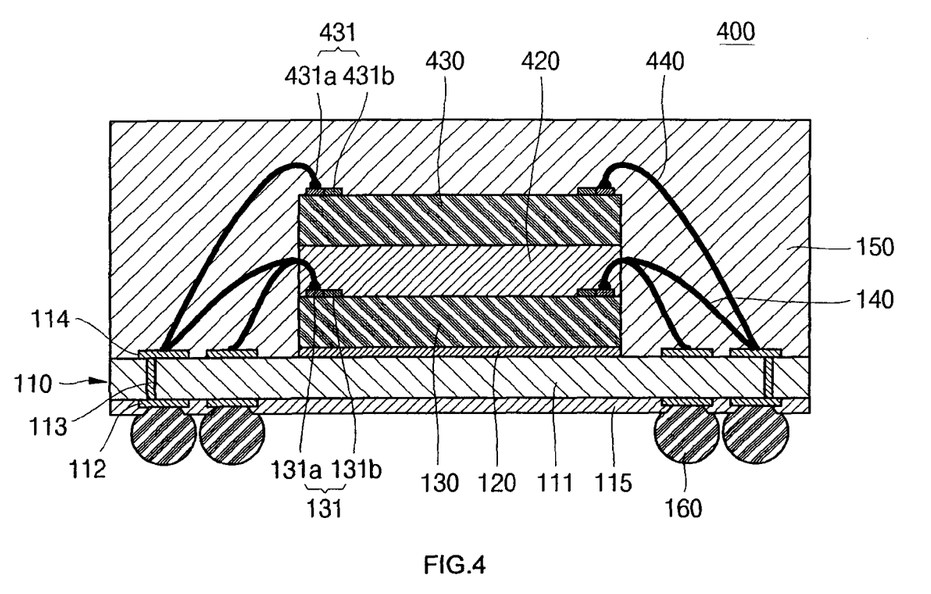
FIG. 4 is a cross-sectional view illustrating a semiconductor device according to another embodiment of the present invention.

Referring to FIG. 4, there is illustrated a cross-sectional view of the semiconductor device 400.

As illustrated in FIG. 4, the semiconductor device 400 comprises a substrate 110, a semiconductor die 130 attached to the substrate 110 by means of an adhesive 120, conductive wires 140, a film-over-wire (FOW) 420 formed on the semiconductor die, another semiconductor die 430 stacked on the FOW 420, conductive wires 440 connecting the semiconductor die 430 to the substrate 110, and an encapsulant 150. The semiconductor device 400 may further comprise solder balls 160 formed under the substrate 110. The same reference numerals are used to designate elements having the same structure and function as the elements of the previous embodiments. Differences of the semiconductor device 400 from the semiconductor devices 100, 200 and 300 will be mainly explained below.

The FOW 420 is formed so as to surround wire loops of the conductive wires 140 connected to the semiconductor die 130. The FOW 420 can be formed of a general epoxy resin.

The FOW 420 has a uniform thickness and the semiconductor die 430 is stacked thereon. The FOW 420 may surround portions of the conductive wires 140 before being solidified. Alternatively, the FOW 420 may be attached to the lower surface of the semiconductor die 430, bonded to upper portions of the conductive wires 140, and solidified.

The FOW 420 is solidified by heating. However, heating may increase the risk of galvanic corrosion at the interfaces between the first bond pads 131a and the conductive wires 140. This risk can be avoided by forming second bond pads 131*b* in lateral contact with the first bond pads 131*a* using a material having a higher ionization tendency than a material for the first bond pads 131*a* to function as sacrificial anodes. Accordingly, corrosion occurs in the second bond pads 131*b* rather than in the first bond pads 131*a*. That is, the second bond pads 131*b* prevent the occurrence of corrosion at the interfaces between the first bond pads 131*a* and the conductive wires 140, which makes the bonding between the first bond pads 131*a* and the conductive wires 140 stronger.

The semiconductor die 430 stacked on the FOW 420 has the same constitution as the semiconductor die 130. That is, the semiconductor die 430 includes bond pads 431 (431*a*; 431*b*) corresponding to the bond pads 131 of the semiconductor die 130. Each of the bond pads 431 is divided into the first bond pad 431*a* and the second bond pad 431*b* in lateral contact with the first bond pad 431*a*. The semiconductor die 430 may be provided in plurality. In this case, a plurality of FOWs may also be used to stack the semiconductor dies 430.

The semiconductor die 130 and the semiconductor die 430 exemplify the semiconductor die 130 of the semiconductor device 100 according to the previous embodiment of the present invention. However, it should be understood that the semiconductor die 130 and the semiconductor die 430 can be independently selected from the semiconductor dies 130, 230 and 330 of the semiconductor devices 100, 200 and 300 according to the previous embodiments of the present invention.

The conductive wires 440 electrically connect lands 114 of the substrate 110 and the first bond pads 431*a* of the semiconductor die 430. The conductive wires 440 have the same constitution as the conductive wires 140.

As described above, in the semiconductor device 400 according to the embodiment of the present invention, at least one semiconductor die 430 can be stacked on the FOW 420 overlying the semiconductor die 130, and the semiconductor die 130 includes the first bond pads 131*a* and the second bond pads 131*b*. This construction can prevent the occurrence of corrosion at the interfaces between the first bond pads 131*a* and the conductive wires 140 during heating for the solidification of the FOW 420.

Although not particularly shown, according to another embodiment of the present invention, there is provided a semiconductor device having a lead frame structure. Specifically, the semiconductor device comprises a lead frame having lands exposed to the lower surface thereof and/or leads exposed to the side surfaces thereof as a substrate, a semiconductor die attached to the upper surface of the substrate and having bond pads on the upper surface thereof, and conductive wires connecting the lands and/or the leads of the substrate to the bond pads of the semiconductor die. Each of the bond pads of the semiconductor die consists of a first bond pad made of a material whose ionization tendency is relatively low and a second bond pad made of a material whose ionization tendency is relatively high. Therefore, the second bond pads function as sacrificial anodes to prevent the occurrence of galvanic corrosion in the first bond pads bonded to the conductive wires.

An explanation of a method for fabricating the semiconductor device 100 according to an embodiment of the present invention will be provided below.

Figure 5:
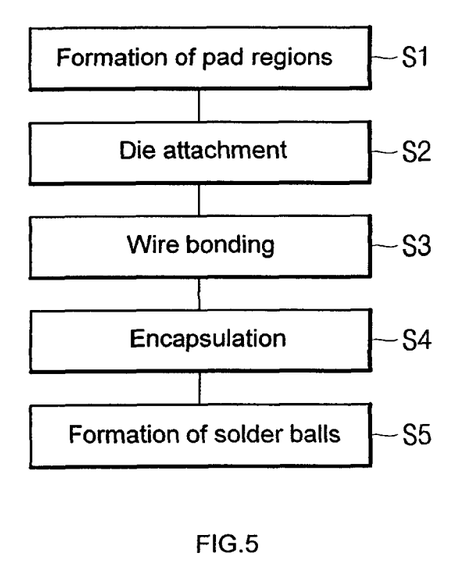
FIG. 5 is a flow chart for explaining a method for fabricating a semiconductor device according to an embodiment of the present invention.

Referring to FIG. 5, there is illustrated a flow chart for explaining the method according to the embodiment of the present invention. Referring to FIGS. 6A through 6F, there are illustrated cross-sectional views for explaining the method according to the embodiment of the present invention.

As illustrated in FIG. 5, the method comprises the following operations: a formation of pad regions operation S1, a die attachment operation S2, a wire bonding operation S3 and an encapsulation operation S4. The method may further comprise the operation of a formation of solder balls operation S5 after encapsulation operation S4. The individual operations of the method illustrated in FIG. 5 will be explained with reference to FIGS. 6A through 6F.

Figure 6A:
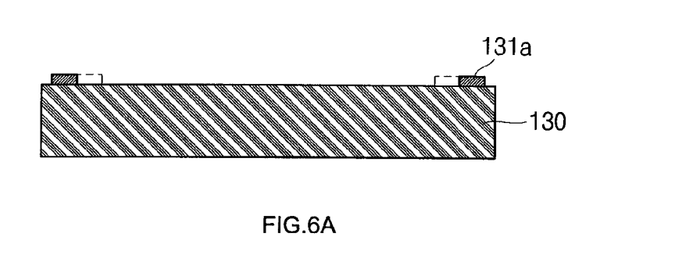
FIGS. 6A, 6B, 6C, 6D, 6E, 6F are cross-sectional views for explaining a method for fabricating a semiconductor device according to an embodiment of the present invention.
Figure 6B:
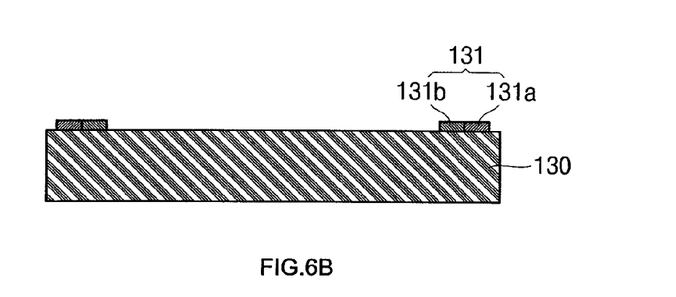

As illustrated in FIGS. 5, 6A and 6B, bond pads 131 (131*a*; 131*b*) are formed on a semiconductor die 130 in formation of pad regions operation S1. Specifically, the first bond pads 131*a* are formed on the semiconductor die 130, and then the second bond pads 131*b* are formed so as to be in lateral contact with the respective first bond pads 131*a*. The second bond pads 131*b* are positioned more inwardly than the first bond pads 131*a* with respect to the plane of the semiconductor die 130. The second bond pads 131*b* can be formed by forming a pattern using a photoresist, plating a metal on the pattern by electroplating or electroless plating, and removing the photoresist. The metal can be selected from magnesium, magnesium alloys, zinc, zinc alloys, cadmium, beryllium and combinations thereof.

Figure 6C:
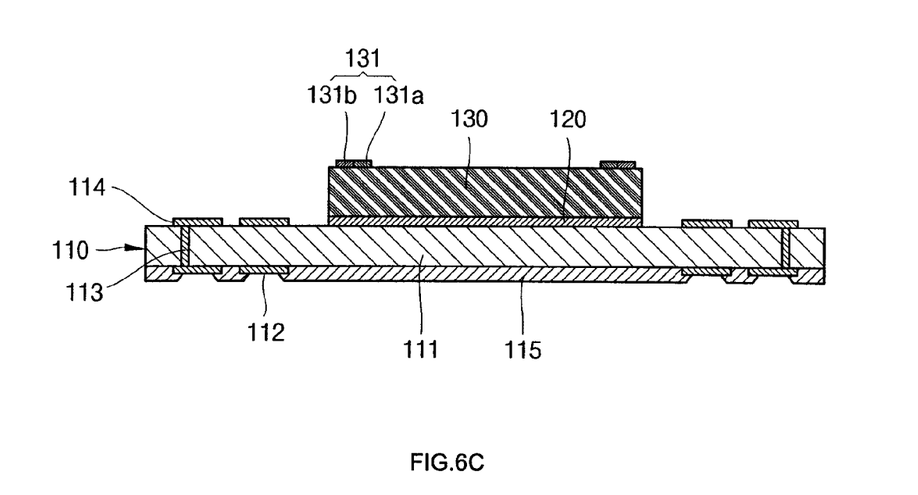

As illustrated in FIGS. 5 and 6C, the semiconductor die 130 is attached to the upper surface of a substrate 110 by means of an adhesive 120 in die attachment operation S2. Examples of the adhesive 120 include, but are not limited to, epoxy resins, adhesive tapes and equivalents thereof.

Figure 6D:
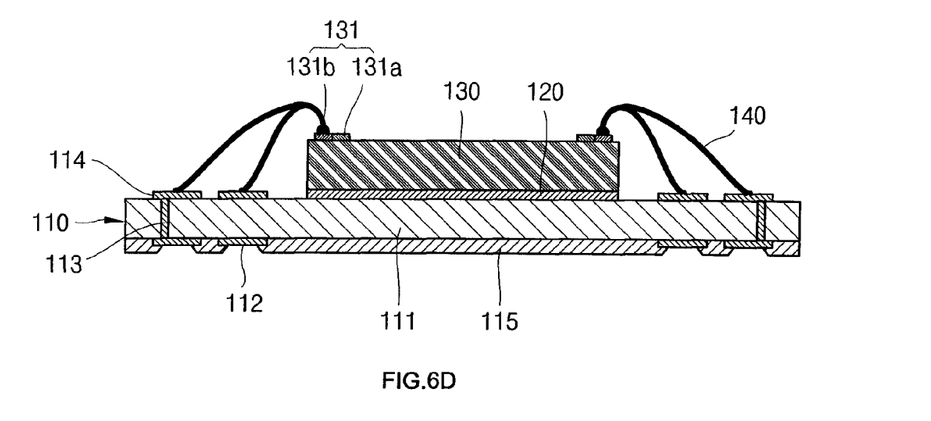

As illustrated in FIGS. 5 and 6D, the substrate 110 is electrically connected to the semiconductor die 130 through conductive wires 140 in wire bonding operation S3. Specifically, the conductive wires 140 electrically connect conductive patterns 114 of the substrate 110 and the first bond pads 131*a* of the semiconductor die 130. The conductive wires 140 can be made of a material selected from gold, silver, copper and combinations thereof. The second bond pads 131*b* prevent the occurrence of galvanic corrosion at the interfaces between the conductive wires 140 and the first bond pads 131*a*.

Figure 6E:
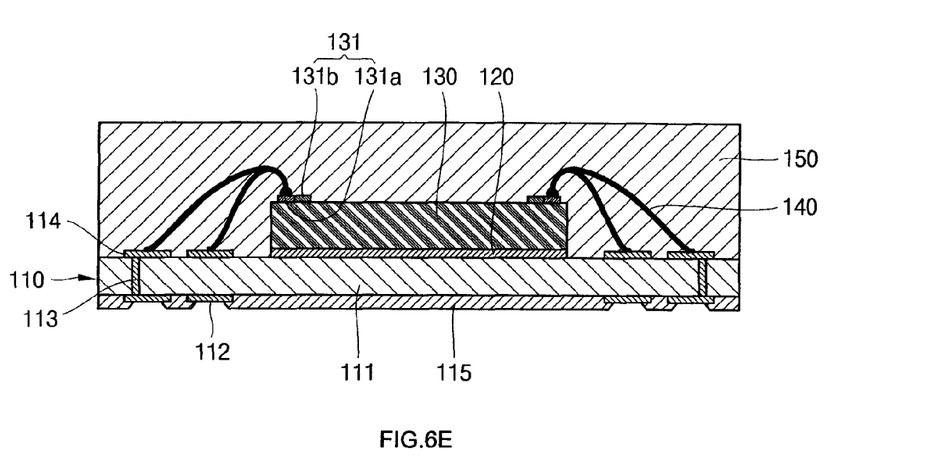

Thereafter, the semiconductor die 130 and the conductive wires 140 are surrounded by an encapsulant 150 in encapsulation operation S4, as illustrated in FIG. 5 and FIG. 6E. Suitable materials for the encapsulant 150 include epoxy resins, silicone resins and equivalents thereof, but are not limited thereto.

Figure 6F:
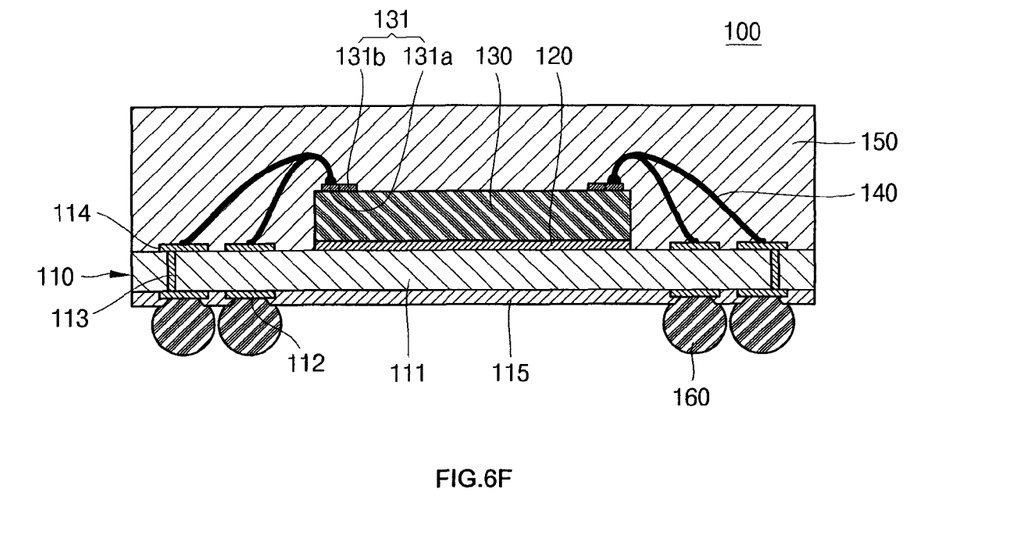

The method may further comprise the operation of forming solder balls 160 on the lower surface of the substrate 110 in solder balls operation S5, as illustrated in FIG. 5 and FIG. 6F. The solder balls 160 are electrically connected to lands 112 of the substrate 110. The solder balls 160 can be made of a material selected from tin, lead, silver, silver alloys and combinations thereof.

As already explained, in the semiconductor device 100, the second bond pads 131*b* prevent the occurrence of galvanic corrosion at the interfaces between the first bond pads 131*a* and the conductive wires 140.

Although not particularly shown, in the semiconductor device 200 of FIGS. 2A, 2B, formation of pad regions operation S1 may be carried out by forming first bond pads 231*a*, etching portions of the first bond pads 231*a*, and electroplating or electroless plating a metal on the etched portions to form second bond pads 231*b*.

In the semiconductor device 300 of FIGS. 3A, 3B, formation of pad regions operation S1 may be carried out by forming first bond pads 331*a* and electroplating or electroless plating a metal on the inner upper surfaces of the first bond pads 331*a* to form second bond pads 331*b*.

The subsequent operations are the same as those of the method for fabricating the semiconductor device 100.

In the semiconductor device 400 of FIG. 4, a series of operations of forming a FOW 420, attaching a semiconductor die 430 to the FOW 420 and connecting the substrate 110 to the semiconductor die 430 through conductive wires 440 is repeated at least one time between wire bonding operation S3 and encapsulation operation S4.

Although not particularly shown, the semiconductor device having a lead frame structure can be fabricated by preparing a lead frame as the substrate and carrying out operations S1 through S4.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process, may be implemented by one skilled in the art in view of this disclosure.

What is claimed is:

1. A semiconductor device, comprising:
    a substrate comprising a conductive pattern;
    a semiconductor die attached to an upper surface of the substrate, the semiconductor die comprising a bond pad on an upper surface of the semiconductor die, the bond pad comprising a protected bond pad and a sacrificial bond pad electrically connected to the protected bond pad, wherein the protected bond pad and the sacrificial bond pad are made of different metals;
    a conductive wire electrically connecting the conductive pattern to the bond pad; and
    an encapsulant encapsulating the semiconductor die and the conductive wire.

2. The semiconductor device of claim 1, wherein the sacrificial bond pad comprises a material selected from the group consisting of magnesium, magnesium alloys, zinc, zinc alloys, cadmium, beryllium, and combinations thereof.

3. The semiconductor device of claim 1, wherein the protected bond pad comprises aluminum.

4. The semiconductor device of claim 1, wherein the metal of the protected bond pad has an ionization tendency lower than an ionization tendency of the metal of the sacrificial bond pad.

5. The semiconductor device of claim 1, further comprising a plurality of bond pads comprising protected bond pads, wherein one or more sacrificial bond pads are electrically connected to the protected bond pads.

6. The semiconductor device of claim 1, wherein the bond pad is divided into the protected bond pad and the sacrificial bond pad.

7. The semiconductor device of claim 1, wherein the protected bond pad is positioned outwardly relative to the sacrificial bond pad with respect to a plane parallel to the upper surface of the semiconductor die.

8. The semiconductor device of claim 1, wherein the protected bond pad is parallel to and in lateral contact with the sacrificial bond pad on the upper surface of the semiconductor die.

9. A semiconductor device, comprising:
    a substrate comprising a conductive pattern;
    a semiconductor die attached to an upper surface of the substrate, the semiconductor die comprising a bond pad on an upper surface of the semiconductor die, the bond pad comprising a protected bond pad and a sacrificial bond pad electrically connected to the protected bond pad, wherein the protected bond pad comprises a cavity indented to a predetermined depth from an upper surface of the protected bond pad, the sacrificial bond pad being formed in the cavity;
    a conductive wire electrically connecting the conductive pattern to the bond pad; and
    an encapsulant encapsulating the semiconductor die and the conductive wire.

10. A semiconductor device, comprising:
    a substrate comprising a conductive pattern;
    a semiconductor die attached to an upper surface of the substrate, the semiconductor die comprising a bond pad on an upper surface of the semiconductor die, the bond pad comprising a protected bond pad and a sacrificial bond pad electrically connected to the protected bond pad, wherein the sacrificial bond pad protrudes from an upper surface of the protected bond pad;
    a conductive wire electrically connecting the conductive pattern to the bond pad; and
    an encapsulant encapsulating the semiconductor die and the conductive wire.

11. A semiconductor device, comprising:
    a substrate comprising a conductive pattern;
    a semiconductor die attached to an upper surface of the substrate, the semiconductor die comprising a bond pad on an upper surface of the semiconductor die, the bond pad comprising a protected bond pad and a sacrificial bond pad electrically connected to the protected bond pad;
    a conductive wire electrically connecting the conductive pattern to the bond pad;
    an encapsulant encapsulating the semiconductor die and the conductive wire; and
    a film-over-wire (FOW) formed on the semiconductor die and another semiconductor die stacked on the FOW.

12. A semiconductor device, comprising:
    a substrate comprising a conductive pattern;
    a semiconductor die attached to an upper surface of the substrate, the semiconductor die comprising bond pads on an upper surface of the semiconductor die, the bond pads comprising protected bond pads and at least one sacrificial bond pad electrically connected to the protected bond pads, wherein the protected bond pads and the at least one sacrificial bond pad are made of different metals;
    conductive wires electrically connecting the conductive pattern to the bond pads; and
    an encapsulant encapsulating the semiconductor die and the conductive wires.

13. A method for fabricating a semiconductor device comprising:
    forming a bond pad on an upper surface of a semiconductor die, the bond pad comprising a protected bond pad and a sacrificial bond pad electrically connected to the protected bond pad, wherein the protected bond pad and the sacrificial bond pad are made of different metals;
    attaching a lower surface of the semiconductor die to an upper surface of a substrate;
    electrically connecting the protected bond pad to a conductive pattern of the substrate through a conductive wire; and
    surrounding the semiconductor die by an encapsulant on the upper surface of the substrate.

14. The method of claim 13, wherein the sacrificial bond pad comprises a material selected from the group consisting of magnesium, magnesium alloys, zinc, zinc alloys, cadmium, beryllium, and combinations thereof.

15. The method of claim 13, wherein the protected bond pad comprises aluminum.

16. The method of claim 13, wherein the protected bond pad is parallel to and in lateral contact with the sacrificial bond pad on the upper surface of the semiconductor die.

17. A method for fabricating a semiconductor device comprising:
- forming a bond pad on an upper surface of a semiconductor die, the bond pad comprising a protected bond pad and a sacrificial bond pad electrically connected to the protected bond pad, wherein the protected bond pad comprises a cavity indented to a predetermined depth from an upper surface of the protected bond pad, the sacrificial bond pad being formed in the cavity;
- attaching a lower surface of the semiconductor die to an upper surface of a substrate;
- electrically connecting the protected bond pad to a conductive pattern of the substrate through a conductive wire; and
- surrounding the semiconductor die by an encapsulant on the upper surface of the substrate.

18. A method for fabricating a semiconductor device comprising:
- forming a bond pad on an upper surface of a semiconductor die, the bond pad comprising a protected bond pad and a sacrificial bond pad electrically connected to the protected bond pad, wherein the sacrificial bond pad protrudes from an upper surface of the protected bond pad;
- attaching a lower surface of the semiconductor die to an upper surface of a substrate;
- electrically connecting the protected bond pad to a conductive pattern of the substrate through a conductive wire; and
- surrounding the semiconductor die by an encapsulant on the upper surface of the substrate.

* * * * *